United States Patent
Lin et al.

(10) Patent No.: US 8,922,405 B2
(45) Date of Patent: Dec. 30, 2014

(54) SUCCESSIVE APPROXIMATION REGISTER ANALOG-TO-DIGITAL CONVERTER AND CONVERSION TIME CALIBRATION METHOD THEREOF

(71) Applicant: Realtek Semiconductor Corporation, Hsinchu (TW)

(72) Inventors: Jian-ru Lin, Nantou County (TW); Yu-Chang Chen, New Taipei (TW); Shin-syong Huang, Changhua County (TW)

(73) Assignee: Realtek Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/055,413

(22) Filed: Oct. 16, 2013

(65) Prior Publication Data
US 2014/0197972 A1      Jul. 17, 2014

(30) Foreign Application Priority Data
Jan. 14, 2013    (TW) .............................. 102101306 A (51) Int. Cl.
*H03M 1/10*    (2006.01)
*H03M 1/06*    (2006.01)

(52) U.S. Cl.
CPC ....................................... *H03M 1/06* (2013.01)
USPC ............................ 341/120; 341/155; 341/161

(58) Field of Classification Search
CPC .................................. H03M 1/10; H03M 1/00
USPC ........................................... 341/155, 120, 118
See application file for complete search history.

(56) References Cited

U.S. PATENT DOCUMENTS

| | | | | |
|---|---|---|---|---|
| 4,647,907 | A * | 3/1987 | Storey | 341/118 |
| 5,519,644 | A * | 5/1996 | Benton | 702/88 |
| 7,408,490 | B2 * | 8/2008 | Melanson et al. | 341/120 |
| 7,786,908 | B2 * | 8/2010 | Yoshinaga | 341/118 |

* cited by examiner

*Primary Examiner* — Jean B Jeanglaude
(74) *Attorney, Agent, or Firm* — Christensen Fonder P.A.

(57) ABSTRACT

A successive approximation register analog-to-digital converter and a conversion time calibration method thereof are provided. The successive approximation register analog-to-digital converter includes a conversion circuit and a conversion time calibration apparatus. The conversion circuit has a conversion time under a process, voltage, and temperature (PVT) variation. The conversion time calibration apparatus is configured to detect a conversion time condition and adjust the conversion time of the conversion circuit according to the conversion time condition.

16 Claims, 6 Drawing Sheets

SUCCESSIVE APPROXIMATION REGISTER ANALOG-TO-DIGITAL CONVERTER AND CONVERSION TIME CALIBRATION METHOD THEREOF

This application claims priority to Taiwan Patent Application No. 102101306 filed on Jan. 14, 2013, which is hereby incorporated by reference in its entirety.

CROSS-REFERENCES TO RELATED APPLICATIONS

Not applicable.

BACKGROUND OF THE INVENTION

1. Field of the Invention

The present invention relates to a successive approximation register analog-to-digital converter and a conversion time calibration method thereof. More particularly, the present invention relates to a successive approximation register analog-to-digital converter capable of calibrating a conversion time and a conversion time calibration method thereof.

2. Descriptions of the Related Art

Analog-to-digital converters can convert successive analog signal into discrete digital signals. Among those analog-to-digital converters, successive approximation register analog-to-digital converters have found more and more applications in recent years.

However, under different process, voltage, and temperature (PVT) variations, conversion times taken by a successive approximation register analog-to-digital converter to convert analog voltages into digital voltages may significantly vary from each other. In terms of the conversion time of the successive approximation register analog-to-digital converter, the PVT variation may cause a problem no matter whether it results in increase of the conversion time or decrease of the conversion time. When the PVT variation results in increases of the conversion time of the successive approximation register analog-to-digital converter, an incomplete conversion process may be caused because the conversion time is longer than a rated conversion time; and when the PVT variation results in decrease of the conversion time of the successive approximation register analog-to-digital converter, an inaccurate conversion result may be caused because of the too fast conversion process.

To solve the problem that the PVT variation may increase the conversion time, the conventional successive approximation register analog-to-digital converter often must be over-designed according to a relatively high speed in order to make the performance of the successive approximation register analog-to-digital converter stable. However, this practice of over-design will cause waste in area or power consumption of the circuit.

On the other hand, to solve the problem that the PVT variation may decrease the conversion time, the conventional successive approximation register analog-to-digital converter must be provided with a more accurate time synchronization function during design so as to overcome the problem of the inaccurate conversion result. However, having the more accurate time synchronization function will cause a burden on the cost.

Accordingly, an urgent need exists in the art to improve the problem that the PVT variations may cause abnormal changes in conversion time of the conventional successive approximation register analog-to-digital converter so that the conventional successive approximation register analog-to-digital converter still has an approximately constant conversion time under different PVT variations.

SUMMARY OF THE INVENTION

The present invention provides a successive approximation register analog-to-digital converter. The successive approximation register analog-to-digital converter comprises a conversion circuit and a conversion time calibration apparatus. The conversion circuit has a conversion time under a process, voltage, and temperature (PVT) variation. The conversion time calibration apparatus is configured to detect a conversion time condition of the conversion circuit and adjust the conversion time of the conversion circuit according to the conversion time condition.

The present invention further provides a conversion time calibration method for use in a successive approximation register analog-to-digital converter. The successive approximation register analog-to-digital converter comprises a conversion circuit and a conversion time calibration apparatus. The conversion circuit has a conversion time under a PVT variation. The conversion time calibration method comprises the following steps of:

(a) detecting a conversion time condition of the conversion circuit by the conversion time calibration apparatus; and (b) adjusting the conversion time of the conversion circuit by the conversion time calibration apparatus according to the conversion time condition.

According to the above descriptions, the present invention provides a successive approximation register analog-to-digital converter and a conversion time calibration method thereof. The successive approximation register analog-to-digital converter and the conversion time calibration method thereof according to the present invention can detect a conversion time condition of the successive approximation register analog-to-digital converter under a PVT variation and adjust a conversion time of the successive approximation register analog-to-digital converter according to the conversion time condition.

Through the aforesaid operations, the successive approximation register analog-to-digital converter can effectively improve the problem that different PVT variations may cause abnormal changes in conversion time so that the successive approximation register analog-to-digital converter still has an approximately constant conversion time under different PVT variations.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

In the following descriptions, the present invention will be explained with reference to embodiments thereof. In the following embodiments and the attached drawings, elements not directly related to the present invention are omitted from depiction; and dimensional relationships among individual elements in the attached drawings are illustrated only for ease of understanding but not to limit the actual scale.

Figure 1:
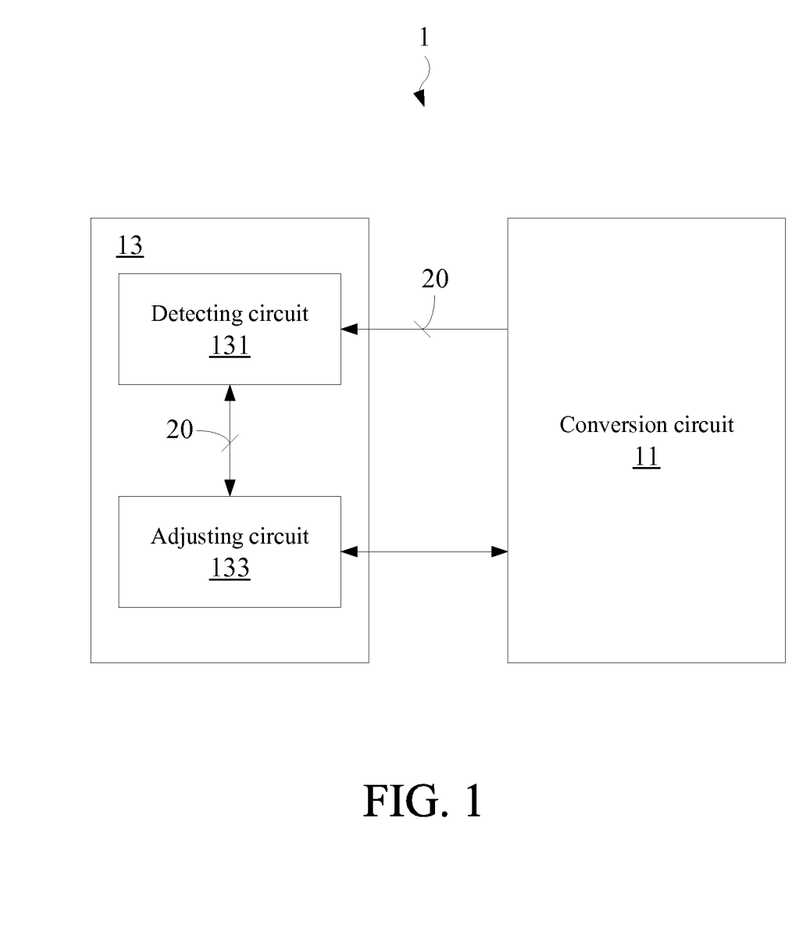
FIG. 1 is a schematic view of a successive approximation register analog-to-digital converter 1 according to a first embodiment of the present invention.

A successive approximation register analog-to-digital converter having a conversion time calibration apparatus will be elucidated in a first embodiment of the present invention. As shown in FIG. 1, the successive approximation register analog-to-digital converter 1 comprises a conversion circuit 11 and a conversion time calibration apparatus 13. The conversion time calibration apparatus 13 comprises a detecting circuit 131 and an adjusting circuit 133 which is electrically connected to the detecting circuit 131 and the conversion circuit 11.

The conversion circuit 11 of the successive approximation register analog-to-digital converter 1 has a conversion time under a process, voltage, and temperature (PVT) variation, and the conversion time is a time taken by the conversion circuit 11 to convert an analog voltage into a digital voltage (a set of digital codes of several bits). The PVT variation generally refers to the process variation, the voltage variation and the temperature variation, and is commonly used to represent three major factors having an influence on the performance of an electronic product. In this embodiment, the PVT variation has an influence on the conversion time of the conversion circuit 11; that is, the conversion time of the conversion circuit 11 varies under different PVT variations.

In general, the conversion circuit 11 of the successive approximation register analog-to-digital converter 1 is designed to have different rated conversion times according to different specifications; and ideally, the conversion time of the conversion circuit 11 shall be within a normal operating range (i.e., the conversion time of the conversion circuit 11 shall be close to but no longer than a rated conversion time). However, the conversion time of the conversion circuit 11 may be affected by the PVT variation to become longer than or shorter than the rated conversion time, thus leading to the problems such as the incomplete conversion process or the inaccurate conversion result.

To overcome the aforesaid problems, the detecting circuit 131 of the conversion time calibration apparatus 13 can be used to detect a conversion time condition 20 corresponding to the conversion circuit 11 under a PVT variation. The conversion time condition 20 at least can be used to indicate whether the conversion time of the conversion circuit 11 under the PVT variation is longer than or shorter than a rated conversion time. Next, the adjusting circuit 133 can be used to adjust the conversion time of the conversion circuit 11 according to the conversion time condition 20 so that the conversion time of the conversion circuit 11 is close to but no longer than the rated conversion time. In other words, through the aforesaid operations, the conversion time of the conversion circuit 11 can be calibrated to be within the normal operating range under a PVT variation.

For example, when the conversion time condition 20 detected by the detecting circuit 131 shows that the conversion time of the conversion circuit 11 is shorter than the rated conversion time, the adjusting circuit 133 adjusts the conversion time of the conversion circuit 11 according to the conversion time condition 20 so that the conversion time of the conversion circuit 11 in increased to be close to but no longer than the rated conversion time. Furthermore, when the conversion time condition 20 detected by the detecting circuit 131 indicates that the conversion time of the conversion circuit 11 is longer than the rated conversion time, the adjusting circuit 133 adjusts the conversion time of the conversion circuit 11 according to the conversion time condition 20 so that the conversion time of the conversion circuit 11 is decreased to be close to or slightly shorter than the rated conversion time.

The architecture of the conversion circuit 11 of the successive approximation register analog-to-digital converter 1 in this embodiment may adopt the architecture of any conventional successive approximation register analog-to-digital converter.

Figure 2:
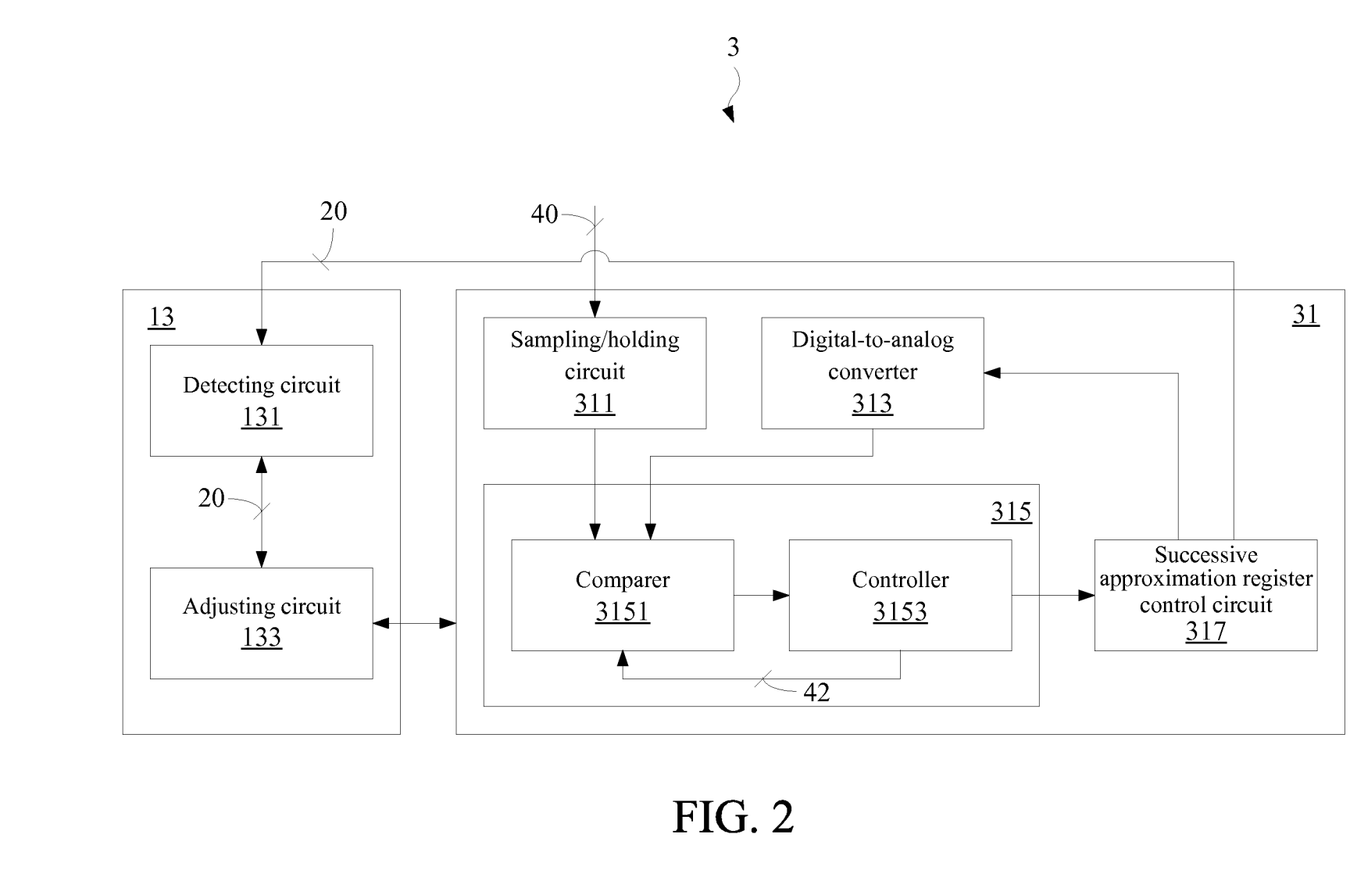
FIG. 2 is a schematic view of a successive approximation register analog-to-digital converter 3 according to a second embodiment of the present invention.

A successive approximation register analog-to-digital converter having a conversion time calibration apparatus will be elucidated in a second embodiment of the present invention. As shown in FIG. 2, the successive approximation register analog-to-digital converter 3 comprises a conversion circuit 31 and a conversion time calibration apparatus 13. The conversion time calibration apparatus 13 comprises a detecting circuit 131 and an adjusting circuit 133 which is electrically connected to the detecting circuit 131 and the conversion circuit 31. The conversion circuit 31 comprises a sampling/holding circuit 311, a digital-to-analog converter 313, a comparison circuit 315 and a successive approximation register control circuit 317.

The sampling/holding circuit 311 is configured to sample and hold an analog input voltage 40 and transmit an analog voltage to the comparison circuit 315, and the comparison circuit 315 is configured to compare the analog voltage with a prediction voltage outputted by the digital-to-analog converter 313. The successive approximation register control circuit 317 is configured to control a prediction voltage, which is to be outputted by the digital-to-analog converter 313 for the next time, by using the binary search algorithm and according to the output of the comparison circuit 315 so that the prediction voltage outputted by the digital-to-analog converter 313 can successively approximate the analog voltage. This is the basic conversion process of the successive approximation register analog-to-digital converter 3. The detailed process flow of the aforesaid conversion executed by the conversion circuit 31 can be readily understood by those of ordinary skill in the art, and thus will not be further described herein.

The comparison circuit 315 may comprise a comparer 3151 and a controller 3153 electrically connected to the comparer 3151. The controller 3153 is configured to control the comparer 3151 to enter a comparison stage or a reset stage. When the output of the sampling/holding circuit 311 and the output of the digital-to-analog converter 313 are transmitted to the comparer 3151, the controller 3153 will control the comparer 3151 to enter the comparison stage so that the comparer 3151 compares the output of the sampling/holding circuit 311 with the output of the digital-to-analog converter 313. After the comparison is completed by the comparer 3151, the controller outputs the comparison result of the comparer 3151 to the successive approximation register control circuit 317, which then uses the binary search algorithm to control a prediction voltage that is to be outputted by the digital-to-analog converter 313 for the next time. At this point, the controller 3153 further returns a reset signal to the comparer 3151 so that the comparer 3151 enters the reset stage and waits to enter a next comparison stage.

In general, the controller 3153 may consist of a plurality of logic gates (e.g., an NAND gate, an XOR gate and the like) with different functions. Because the logic gates are subject to the influence of the PVT variation, signal transmissions between the comparer 3151 and the controller 3153 are accelerated or delayed due to the PVT variation to result in an increased or decreased conversion time of the conversion circuit 31. In other words, the accelerated or delayed signal transmissions between the comparer 3151 and the controller 3153 are one of the main causes that increase or decrease the conversion time of the conversion circuit 31 due to the PVT variation.

A conventional N-bit successive approximation register analog-to-digital converter needs to take N correction periods in total to convert an analog voltage into a digital voltage. Therefore, the conversion circuit 31 of this embodiment needs to take N correction periods in total to convert an analog voltage into an N-bit digital voltage (a set of digital codes of several bits), where N is a positive integer. For example, when N is 3, the conversion circuit 31 has to take three correction periods in total to convert an analog voltage into a digital voltage represented by 3 bits. On the basis of this characteristic, the detecting circuit 131 of the conversion time calibration apparatus 13 of this embodiment detects the conversion time condition 20 of the conversion circuit 31 according to the $N^{th}$ correction period of the conversion circuit 31.

Because the successive approximation register control circuit 317 itself has the function of counting the aforesaid correction periods, the detecting circuit 131 of the conversion time calibration apparatus 13 can monitor the successive approximation register control circuit 317 of the conversion circuit 31 to learn whether the conversion circuit 31 enters the $N^{th}$ correction period, thereby detecting the conversion time condition 20 of the conversion circuit 31.

In detail, when the conversion circuit 31 enters the $N^{th}$ correction period, the successive approximation register control circuit 317 will control for the last time a prediction voltage outputted by the digital-to-analog converter 313. At this point, the detecting circuit 131 of the conversion time calibration apparatus 13 can learn from the information a conversion time taken by the conversion circuit 31 to complete the conversion, and detect the conversion time condition 20 of the conversion circuit 31 according to a difference between the conversion time and the rated conversion time. In this case, the conversion time condition 20 may indicate that the conversion time of the conversion circuit 31 is shorter than the rated conversion time or that the conversion time of the conversion circuit 31 is longer than the rated conversion time.

The adjusting circuit 133 can further adjust the conversion time of the conversion circuit 31 according to the conversion time condition 20 detected by the detecting circuit 131. In this embodiment, the adjusting circuit 133 can adjust the conversion time of the conversion circuit 31 by changing one of an operating voltage and an operating current of the successive approximation register analog-to-digital converter 3.

When the conversion time condition 20 indicates that the conversion time of the conversion circuit 31 is shorter than the rated conversion time, the adjusting circuit 133 can increase the conversion time of the conversion circuit 31 to be close to but no longer than the rated conversion time by decreasing one of an operating voltage and an operating current of the successive approximation register analog-to-digital converter 3.

When the conversion time condition 20 indicates that the conversion time of the conversion circuit 31 is longer than the rated conversion time, the adjusting circuit 133 can decrease the conversion time of the conversion circuit 31 to be close to or slightly shorter than the rated conversion time by increasing one of an operating voltage and an operating current of the successive approximation register analog-to-digital converter 3.

Usually, increasing the operating voltage or the operating current can decrease the conversion time, and decreasing the operating voltage or the operating current can increase the conversion time.

Figure 3:
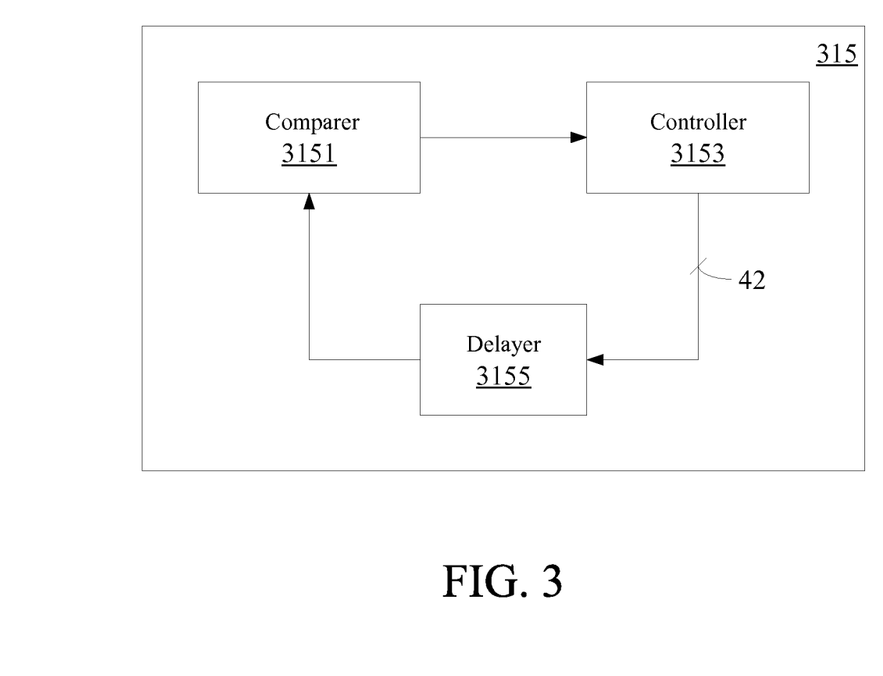
FIG. 3 is a schematic detail view of a comparison circuit 315 according to the second embodiment of the present invention.

In other embodiments, the adjusting circuit 133 may also adjust the conversion time of the conversion circuit 31 by changing a delay time between the controller 3153 and the comparer 3151. This will be illustrated by taking FIG. 3 as an example. FIG. 3 is a schematic detail view of the comparison circuit 315. As shown in FIG. 3, the comparison circuit 315 further comprises a delayer 3155, which is configured to change a delay extent to which the controller 3153 transmits a reset signal 42 to the comparer 3151.

A delay time may be preset for the delayer 3155. In this case, the reset signal 42 is transmitted from the controller 3153 to the comparer 3151 according to the delay time. When the conversion time condition 20 indicates that the conversion time of the conversion circuit 31 is shorter than the rated conversion time, the adjusting circuit 133 can increase the conversion time of the conversion circuit 31 to be close to but no longer than the rated conversion time by increasing the delay time of the delayer 3155. When the conversion time condition 20 indicates that the conversion time of the conversion circuit 31 is longer than the rated conversion time, the adjusting circuit 133 can decrease the conversion time of the conversion circuit 31 to be close to or slightly shorter than the rated conversion time by decreasing the delay time of the delayer 3155.

In other embodiments, a plurality of paths may be established in advance between the controller 3153 and the comparer 3151, and the paths have different delays from each other so that the adjusting circuit 133 can adjust the conversion time of the conversion circuit 31 by changing a transmission path of the reset signal 42 through for example a multiplexer.

When the conversion time condition 20 indicates that the conversion time of the conversion circuit 31 is shorter than the rated conversion time, the adjusting circuit 133 can increase the conversion time of the conversion circuit 31 to be close to but no longer than the rated conversion time by transmitting the reset signal 42 via a path having a longer delay.

When the conversion time condition 20 indicates that the conversion time of the conversion circuit 31 is longer than the rated conversion time, the adjusting circuit 133 can decrease the conversion time of the conversion circuit 31 to be close to or slightly shorter than the rated conversion time by transmitting the reset signal 42 via a path having a shorter delay.

In other embodiments, the adjusting circuit 133 may also adjust the conversion time of the conversion circuit 31 by both changing one of an operating voltage and an operating current of the successive approximation register analog-to-digital converter 3 and changing a delay time between the controller 3153 and the comparer 3151.

Figure 4:
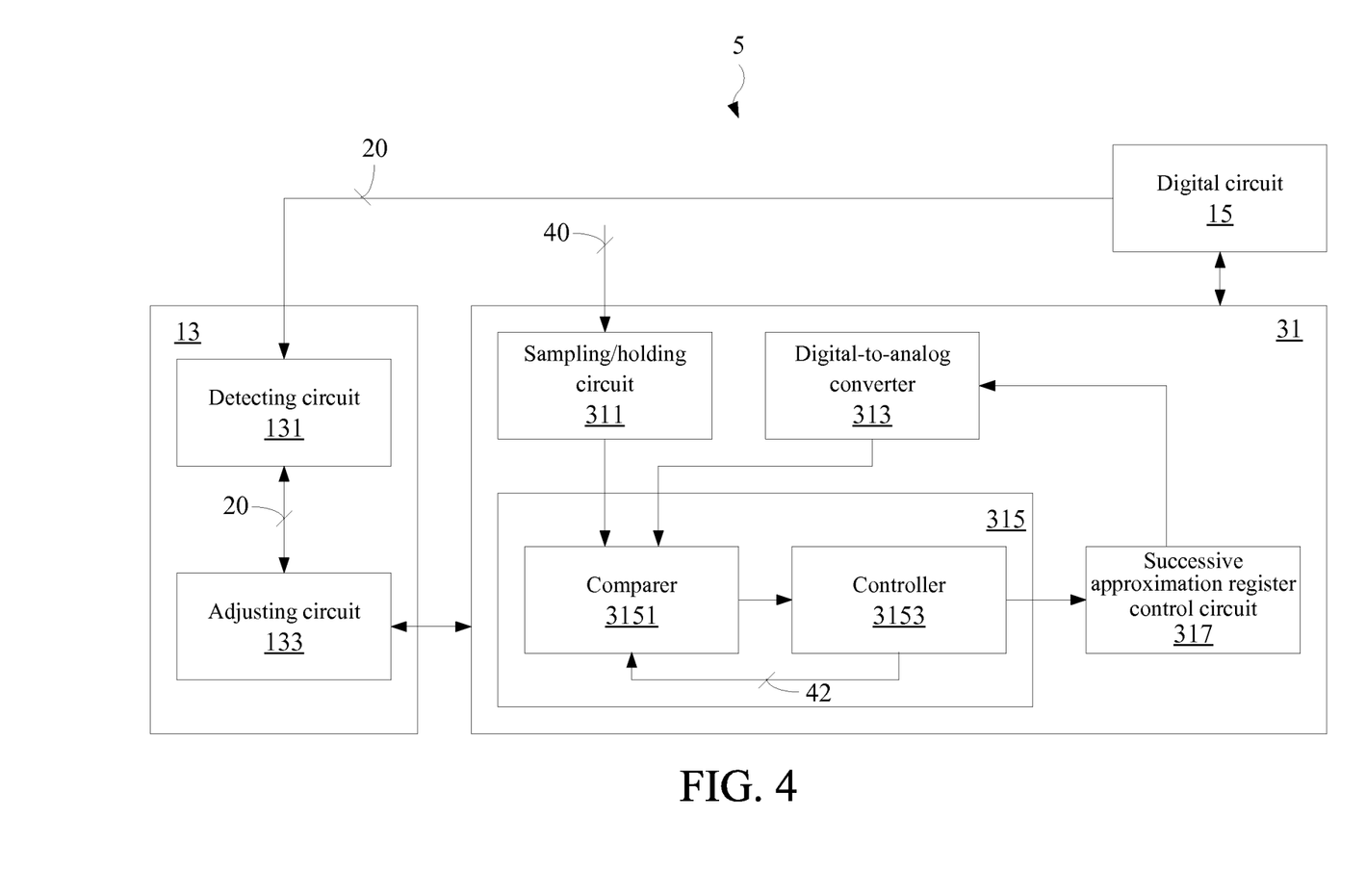
FIG. 4 is a schematic view of a successive approximation register analog-to-digital converter 5 according to a third embodiment of the present invention.

A successive approximation register analog-to-digital converter having a conversion time calibration apparatus will be elucidated in a third embodiment of the present invention. As shown in FIG. 4, the successive approximation register analog-to-digital converter 5 comprises a conversion circuit 31, a conversion time calibration apparatus 13 and a digital circuit 15 that is electrically connected to the conversion circuit 31. The conversion circuit and the conversion time calibration apparatus of this embodiment may be viewed as the conversion circuit 31 and the conversion time calibration apparatus 13 of the second embodiment. The successive approximation register analog-to-digital converter 5 of this embodiment mainly differs from the successive approximation register analog-to-digital converter 3 of the second embodiment in that, the detecting circuit 131 of the conversion time calibration apparatus 13 detects the conversion time condition 20 of the conversion circuit 31 according to a signal-to-noise and distortion ratio (SNDR) or a signal-to-noise ratio (SNR) measured by the digital circuit 15.

One of the functions of the successive approximation register analog-to-digital converter 5 is to convert an analog signal into a digital signal so that the digital signal outputted by the conversion circuit 31 is suitable for various subsequent operations of the digital circuit 15. In general, the digital circuit 15 has the function of measuring an SNDR or an SNR of the successive approximation register analog-to-digital converter 5, and the SNDR or the SNR can not only reflect the performance of the successive approximation register analog-to-digital converter 5, but can also indicate the conversion time condition 20 of the conversion circuit 31. How to detect the conversion time condition 20 of the conversion circuit 31 according to the SNDR or the SNR measured by the digital circuit 15 can be readily understood by those of ordinary skill in the art, and thus will not be further described herein.

The detecting circuit 131 can detect the conversion time condition 20 of the conversion circuit 31 according to the SNDR or the SNR measured by the digital circuit 15. Thereafter, the adjusting circuit 133 can adjust the conversion time of the conversion circuit 31 in either or both of the following ways: changing one of an operating voltage and an operating current of the successive approximation register analog-to-digital converter 5; and changing a delay time between the controller 3153 and the comparer 3151.

Figure 5:
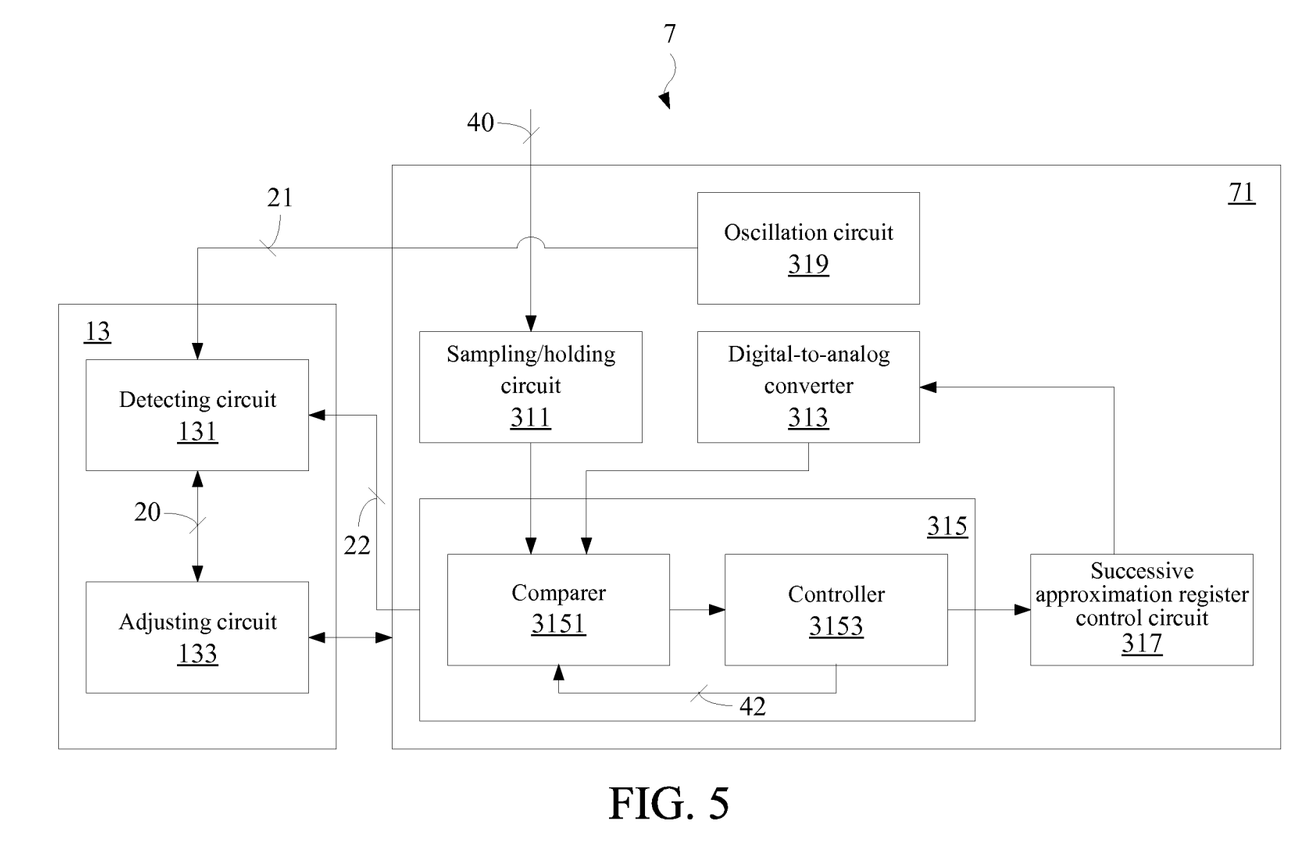
FIG. 5 is a schematic view of a successive approximation register analog-to-digital converter 7 according to a fourth embodiment of the present invention.

A successive approximation register analog-to-digital converter having a conversion time calibration apparatus will be elucidated in a fourth embodiment of the present invention. As shown in FIG. 5, the successive approximation register analog-to-digital converter 7 comprises a conversion circuit 71 and a conversion time calibration apparatus 13. The conversion time calibration apparatus of this embodiment may be viewed as the conversion time calibration apparatus 13 of the previous embodiments. The sampling/holding circuit 311, the digital-to-analog converter 313, the comparison circuit 315 and the successive approximation register control circuit 317 comprised in the conversion circuit 71 may be viewed as those of the previous embodiments.

The successive approximation register analog-to-digital converter 7 of this embodiment mainly differs from the successive approximation register analog-to-digital converter 3 of the second embodiment in that, the conversion circuit 71 further comprises an oscillation circuit 319. The oscillation circuit 319 has an oscillation period 21, and the oscillation period 21 is free from the influence of the PVT variation. In other words, the oscillation period 21 does not vary with the PVT variation; that is, variations of the oscillation period 21 attributed due to the PVT variation are negligible or acceptable. Because the oscillation period 21 of the oscillation circuit 319 is free from the influence of the PVT variation, the conversion time condition 20 can be obtained according to the oscillation period 21 of the oscillation circuit 319 and the conversion time 22 of the conversion circuit 71 under the PVT variation when the oscillation circuit 319 (e.g., a quartz oscillator) is disposed for the counting purpose in the conversion circuit 71. The oscillation circuit 319 (e.g., a quartz oscillator) may also be externally connected; that is, the accurate oscillation period 21 may be inputted from the outside or generated by a phase-locked loop (not shown).

In this embodiment, the conversion time 22 of the conversion circuit 71 is detected by the controller 3153 of the comparison circuit 315; however, the conversion time 22 of the conversion circuit 71 may also be detected by other circuits (e.g., the successive approximation register control circuit 317) of the conversion circuit 71. Therefore, the detecting circuit 131 can obtain the conversion time condition 20 through a comparison of the oscillation period 21 with the conversion time 22 of the conversion circuit 71 which is detected. Thereafter, the adjusting circuit 133 can adjust the conversion time 22 of the conversion circuit 71 in either or both of the following ways: changing one of an operating voltage and an operating current of the successive approximation register analog-to-digital converter 7; and changing a delay time between the controller 3153 and the comparer 3151.

Figure 6:
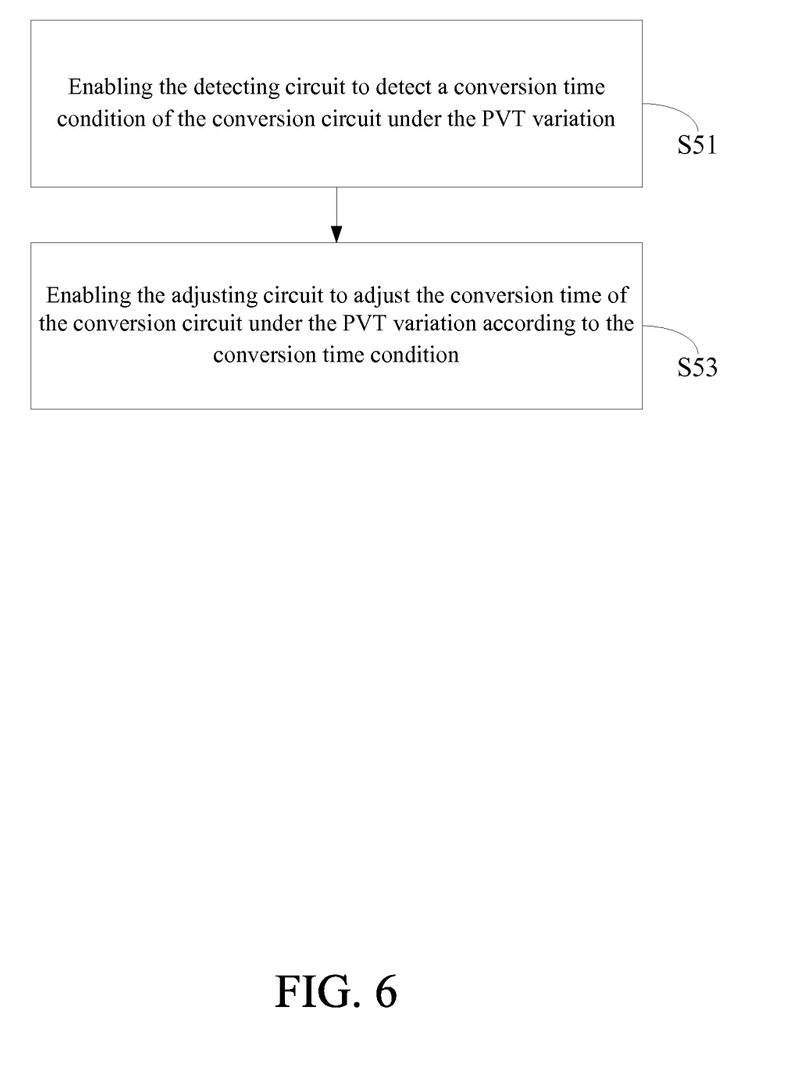
FIG. 6 is a flowchart diagram of a conversion time calibration method for use in a successive approximation register analog-to-digital converter according to a fifth embodiment of the present invention.

A conversion time calibration method for use in a successive approximation register analog-to-digital converter will be elucidated in a fifth embodiment of the present invention. Refer to FIG. 6 for this embodiment. FIG. 6 is a flowchart diagram of a conversion time calibration method for use in a successive approximation register analog-to-digital converter according to the present invention.

The successive approximation register analog-to-digital converter of this embodiment may be one of the successive approximation register analog-to-digital converters 1, 3, 5 and 7 of the previous embodiments. Therefore, the successive approximation register analog-to-digital converter of this embodiment may comprise a conversion circuit and a conversion time calibration apparatus. The conversion time calibration apparatus comprises a detecting circuit and an adjusting circuit which is electrically connected to the detecting circuit and the conversion circuit. The conversion circuit has a conversion time under a PVT variation.

As shown in FIG. 6, step S51 is executed to enable the detecting circuit to detect a conversion time condition of the conversion circuit under the PVT variation; and step S53 is executed to enable the adjusting circuit to adjust the conversion time of the conversion circuit under the PVT variation according to the conversion time condition. In other embodiments, the step S53 may be appropriately replaced by the following step: changing a delay time between the comparer and the controller by the adjusting circuit according to the conversion time condition to adjust the conversion time of the conversion circuit; or changing one of an operating voltage and an operating current of the successive approximation register analog-to-digital converter by the adjusting circuit according to the conversion time condition to adjust the conversion time of the conversion circuit.

When the successive approximation register analog-to-digital converter of this embodiment is the successive approximation register analog-to-digital converter 3 of the second embodiment, the conversion circuit of this embodiment converts an analog voltage into an N-bit digital voltage in N correction periods, where N is a positive integer. In this case, the step S51 may be appropriately replaced by the following step: detecting the conversion time condition of the conversion circuit by the detecting circuit according to the $N^{th}$ correction period of the conversion circuit.

When the successive approximation register analog-to-digital converter of this embodiment is the successive approximation register analog-to-digital converter 5 of the third embodiment, the conversion circuit of this embodiment is further electrically connected to a digital circuit. In this case, the step S51 may be appropriately replaced by the following step: detecting the conversion time condition of the conversion circuit by the detecting circuit according to an SNDR measured by the digital circuit.

When the successive approximation register analog-to-digital converter of this embodiment is the successive approximation register analog-to-digital converter 7 of the fourth embodiment, the step S51 may be appropriately replaced by the following step: obtaining the conversion time condition by the detecting circuit according to a comparison of the oscillation period and the conversion time of the conversion circuit which is detected.

In addition to the aforesaid steps, the fifth embodiment can also execute all the operations set forth in the previous embodiments and accomplish all the corresponding functions. How the conversion time calibration method of the fifth embodiment executes these operations and accomplishes these functions can be readily appreciated by those of ordinary skill in the art based on the explanation of the previous embodiments, and thus will not be further described herein.

According to the above descriptions, the present invention provides a successive approximation register analog-to-digital converter, a conversion time calibration apparatus for use in a successive approximation register analog-to-digital converter and a conversion time calibration method thereof. The conversion time calibration apparatus and the conversion time calibration method according to the present invention can detect a conversion time condition of the successive approximation register analog-to-digital converter under a PVT variation and adjust a conversion time of the successive approximation register analog-to-digital converter according to the conversion time condition.

Through the aforesaid operations, the successive approximation register analog-to-digital converter can effectively improve the problem that different PVT variations may cause abnormal changes in conversion time so that the successive approximation register analog-to-digital converter still has an approximately constant conversion times under different PVT variations.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A conversion time calibration method for use in a successive approximation register analog-to-digital converter, the successive approximation register analog-to-digital converter comprising a conversion circuit and a conversion time calibration apparatus, and the conversion circuit having a conversion time under a process, voltage, and temperature (PVT) variation, the conversion time calibration method comprising the following steps of:
   (a) detecting a conversion time condition of the conversion circuit by the conversion time calibration apparatus; and
   (b) adjusting the conversion time of the conversion circuit by the conversion time calibration apparatus according to the conversion time condition.

2. The conversion time calibration method as claimed in claim 1, wherein the conversion circuit is configured to transform an analog voltage into an N-bit digital voltage in N correction periods, and N is a positive integer; and wherein the step (a) of the conversion time calibration method further comprises the following step of:
   (a1) detecting the conversion time condition of the conversion circuit by the conversion time calibration apparatus according to the $N^{th}$ correction period of the conversion circuit.

3. The conversion time calibration method as claimed in claim 1, wherein the conversion circuit is further electrically connected to a digital circuit; and wherein the step (a) of the conversion time calibration method further comprises the following step of:
   (a1) detecting the conversion time condition of the conversion circuit by the conversion time calibration apparatus according to a signal-to-noise and distortion ratio measured by the digital circuit.

4. The conversion time calibration method as claimed in claim 1, wherein the step (a) of the conversion time calibration method further comprises the following step of:
   (a1) detecting the conversion time condition of the conversion circuit by the conversion time calibration apparatus according to a comparison of an oscillation period with the conversion time of the conversion circuit which is detected.

5. The conversion time calibration method as claimed in claim 1, wherein the conversion circuit comprises a comparison circuit, and the comparison circuit comprises a comparer and a controller electrically connected to the comparer; and wherein the step (b) of the conversion time calibration method further comprises the following step of:
   (b1) changing a delay time between the comparer and the controller by the conversion time calibration apparatus according to the conversion time condition to adjust the conversion time of the conversion circuit.

6. The conversion time calibration method as claimed in claim 1, wherein the step (b) further comprises the following step of:
   (b1) changing one of an operating voltage and an operating current of the successive approximation register analog-to-digital converter by the conversion time calibration apparatus according to the conversion time condition to adjust the conversion time of the conversion circuit.

7. The conversion time calibration method as claimed in claim 1, wherein the conversion time condition indicates that the conversion time is shorter than a rated conversion time, and the conversion time calibration apparatus adjusts the conversion circuit according to the conversion time condition to increase the conversion time to the rated conversion time.

8. The conversion time calibration method as claimed in claim 1, wherein the conversion time condition indicates that the conversion time is longer than a rated conversion time, and the conversion time calibration apparatus adjusts the conversion circuit according to the conversion time condition to decrease the conversion time to the rated conversion time.

9. The conversion time calibration method as claimed in claim 4, wherein the step (b) further comprises the following step of:
   (b1) changing one of an operating voltage and an operating current of the successive approximation register analog-to-digital converter by the conversion time calibration apparatus according to the conversion time condition to adjust the conversion time of the conversion circuit.

10. The conversion time calibration method as claimed in claim 4, wherein the conversion circuit comprises a comparison circuit, and the comparison circuit comprises a comparer and a controller electrically connected to the comparer; and wherein the step (b) of the conversion time calibration method further comprises the following step of:

(b1) changing a delay time between the comparer and the controller by the conversion time calibration apparatus according to the conversion time condition to adjust the conversion time of the conversion circuit.

11. A successive approximation register analog-to-digital converter, comprising:
  a conversion circuit, having a conversion time under a PVT variation; and
  a conversion time calibration apparatus, being configured to detect a conversion time condition of the conversion circuit and adjust the conversion time of the conversion circuit according to the conversion time condition.

12. The successive approximation register analog-to-digital converter as claimed in claim 11, wherein the conversion circuit is configured to transform an analog voltage into an N-bit digital voltage in N correction periods, and N is a positive integer; and wherein the conversion time calibration apparatus is configured to detect the conversion time condition of the conversion circuit according to the $N^{th}$ correction period of the conversion circuit.

13. The successive approximation register analog-to-digital converter as claimed in claim 11, wherein the conversion circuit is further electrically connected to a digital circuit and the conversion time calibration apparatus is configured to detect the conversion time condition of the conversion circuit according to a signal-to-noise and distortion ratio measured by the digital circuit.

14. The successive approximation register analog-to-digital converter as claimed in claim 11, wherein the conversion time calibration apparatus is configured to detect the conversion time condition of the conversion circuit according to a comparison of an oscillation period and the conversion time of the conversion circuit which is detected.

15. The successive approximation register analog-to-digital converter as claimed in claim 11, wherein the conversion circuit comprises a comparison circuit including a comparer and a controller electrically connected to the comparer, and the conversion time calibration apparatus is further configured to change a delay time between the comparer and the controller according to the conversion time condition to adjust the conversion time of the conversion circuit.

16. The successive approximation register analog-to-digital converter as claimed in claim 11, wherein the conversion time calibration apparatus is further configured to change one of an operating voltage and an operating current of the successive approximation register analog-to-digital converter according to the conversion time condition to adjust the conversion time of the conversion circuit.

* * * * *